(12) United States Patent
Kitagawa et al.

(10) Patent No.: US 8,686,526 B2
(45) Date of Patent: Apr. 1, 2014

(54) SEMICONDUCTOR DEVICE AND METHOD OF MANUFACTURING THE SAME

(75) Inventors: Katsuhiko Kitagawa, Gunma (JP); Hiroyuki Shinogi, Gunma (JP); Shinzo Ishibe, Gunma (JP); Hiroshi Yamada, Kanagawa (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 842 days.

(21) Appl. No.: 11/942,506

(22) Filed: Nov. 19, 2007

(65) Prior Publication Data

US 2008/0135967 A1    Jun. 12, 2008

(30) Foreign Application Priority Data

Nov. 20, 2006  (JP) ................................. 2006-313379

(51) Int. Cl.
*H01L 31/0203* (2006.01)
*H01L 31/18* (2006.01)

(52) U.S. Cl.
USPC ........... 257/434; 257/459; 257/466; 257/433; 257/E31.11; 257/E21.205

(58) Field of Classification Search
USPC .................. 257/434, 459, 466, 433, E21.205, 257/E31.11
See application file for complete search history.

(56) References Cited

U.S. PATENT DOCUMENTS

| | | | |
|---|---|---|---|
| 3,648,131 A | 3/1972 | Stuby | |
| 4,807,021 A | 2/1989 | Okumura | |
| 4,851,481 A * | 7/1989 | Kuriyama et al. | ............ 525/454 |
| 4,954,875 A | 9/1990 | Clements | |
| 4,984,358 A | 1/1991 | Nelson | |
| 5,229,647 A | 7/1993 | Gnadinger | |
| 5,420,460 A | 5/1995 | Massingill | |
| 5,424,245 A | 6/1995 | Gurtler et al. | |
| 5,432,999 A | 7/1995 | Capps et al. | |
| 5,463,246 A | 10/1995 | Matsunami | |
| 5,608,264 A | 3/1997 | Gaul | |

(Continued)

FOREIGN PATENT DOCUMENTS

EP    1 471 571    10/2004
JP    10-163250 A1    6/1998

(Continued)

OTHER PUBLICATIONS

Partial European Search Report mailed Oct. 23, 2007 directed to counterpart EP Application No. 07004724.6.

(Continued)

*Primary Examiner* — Cathy N Lam
(74) *Attorney, Agent, or Firm* — Abel Law Group, LLP

(57) ABSTRACT

The invention is directed to providing a semiconductor device receiving a blue-violet laser, of which the reliability and yield are enhanced. A device element converting a blue-violet laser into an electric signal is formed on a front surface of a semiconductor substrate. An optically transparent substrate is attached to the front surface of the semiconductor substrate with an adhesive layer being interposed therebetween. The adhesive layer contains transparent silicone. Since the front surface of the device element is covered by the optically transparent substrate, foreign substances are prevented from adhering to the front surface of the device element. Furthermore, the adhesive layer is covered by the optically transparent substrate. This prevents the adhesive layer from being exposed to outside air, thereby preventing the degradation of the adhesive layer 6 due to a blue-violet laser.

15 Claims, 6 Drawing Sheets

(56) References Cited

U.S. PATENT DOCUMENTS

| | | |
|---|---|---|
| 5,618,752 A | 4/1997 | Gaul |
| 5,646,067 A | 7/1997 | Gaul |
| 5,814,889 A | 9/1998 | Gaul |
| 5,841,197 A | 11/1998 | Adamic, Jr. |
| 5,872,025 A | 2/1999 | Cronin et al. |
| 6,087,719 A | 7/2000 | Tsunashima |
| 6,124,179 A | 9/2000 | Adamic, Jr. |
| 6,322,903 B1 | 11/2001 | Siniaguine et al. |
| 6,350,386 B1 | 2/2002 | Lin |
| 6,350,632 B1 | 2/2002 | Lin |
| 6,383,837 B1 | 5/2002 | Tsunashima |
| 6,388,333 B1 | 5/2002 | Taniguchi et al. |
| 6,420,209 B1 | 7/2002 | Siniaguine |
| 6,437,424 B1 | 8/2002 | Noma et al. |
| 6,440,835 B1 | 8/2002 | Lin |
| 6,444,489 B1 | 9/2002 | Lin |
| 6,448,108 B1 | 9/2002 | Lin |
| 6,448,647 B1 | 9/2002 | Kurita et al. |
| 6,451,626 B1 | 9/2002 | Lin |
| 6,461,956 B1 | 10/2002 | Hsuan et al. |
| 6,492,252 B1 | 12/2002 | Lin et al. |
| 6,509,639 B1 | 1/2003 | Lin |
| 6,522,022 B2 | 2/2003 | Murayama |
| 6,537,851 B1 | 3/2003 | Lin et al. |
| 6,544,813 B1 | 4/2003 | Lin |
| 6,548,393 B1 | 4/2003 | Lin |
| 6,552,426 B2 | 4/2003 | Ishio et al. |
| 6,576,493 B1 | 6/2003 | Lin et al. |
| 6,576,539 B1 | 6/2003 | Lin |
| 6,583,040 B1 | 6/2003 | Lin |
| 6,608,374 B1 | 8/2003 | Lin et al. |
| 6,627,824 B1 | 9/2003 | Lin |
| 6,639,303 B2 | 10/2003 | Siniaguine |
| 6,653,170 B1 | 11/2003 | Lin |
| 6,653,217 B1 | 11/2003 | Lin |
| 6,653,742 B1 | 11/2003 | Lin |
| 6,664,129 B2 | 12/2003 | Siniaguine |
| 6,667,229 B1 | 12/2003 | Lin et al. |
| 6,699,780 B1 | 3/2004 | Chiang et al. |
| 6,717,254 B2 | 4/2004 | Siniaguine |
| 6,740,576 B1 | 5/2004 | Lin et al. |
| 6,765,287 B1 | 7/2004 | Lin |
| 6,794,741 B1 | 9/2004 | Lin et al. |
| 6,809,414 B1 | 10/2004 | Lin et al. |
| 6,809,421 B1 | 10/2004 | Hayasaka et al. |
| 6,844,241 B2 | 1/2005 | Halahan et al. |
| 6,864,172 B2 | 3/2005 | Noma et al. |
| 6,882,030 B2 | 4/2005 | Siniaguine |
| 6,897,148 B2 | 5/2005 | Halahan et al. |
| 6,908,788 B1 | 6/2005 | Lin |
| 6,911,392 B2 | 6/2005 | Bieck et al. |
| 6,982,487 B2 | 1/2006 | Kim et al. |
| 7,001,825 B2 | 2/2006 | Halahan et al. |
| 7,009,297 B1 | 3/2006 | Chiang et al. |
| 7,015,128 B1 | 3/2006 | Chiang et al. |
| 7,067,911 B1 | 6/2006 | Lin et al. |
| 7,071,089 B1 | 7/2006 | Lin et al. |
| 7,071,573 B1 | 7/2006 | Lin |
| 7,075,186 B1 | 7/2006 | Wang et al. |
| 7,094,676 B1 | 8/2006 | Leu et al. |
| 7,101,735 B2 | 9/2006 | Noma et al. |
| 7,102,238 B2 | 9/2006 | Noma et al. |
| 7,112,520 B2 | 9/2006 | Lee et al. |
| 7,112,521 B1 | 9/2006 | Lin et al. |
| 7,112,881 B2 | 9/2006 | Kaida et al. |
| 7,115,972 B2 | 10/2006 | Dotta et al. |
| 7,122,457 B2 | 10/2006 | Tanida et al. |
| 7,129,113 B1 | 10/2006 | Lin et al. |
| 7,129,575 B1 | 10/2006 | Lin et al. |
| 7,132,741 B1 | 11/2006 | Lin et al. |
| 7,190,080 B1 | 3/2007 | Leu et al. |
| 7,208,340 B2 | 4/2007 | Noma |
| 7,232,706 B1 | 6/2007 | Wang et al. |
| 7,232,707 B1 | 6/2007 | Wang et al. |
| 7,271,466 B2 | 9/2007 | Noma et al. |
| 7,312,107 B2 | 12/2007 | Noma et al. |
| 7,312,521 B2 | 12/2007 | Noma et al. |
| 7,319,265 B1 | 1/2008 | Wang et al. |
| 7,371,693 B2 | 5/2008 | Suzuki et al. |
| 7,397,134 B2 | 7/2008 | Noma |
| 7,413,931 B2 | 8/2008 | Noma et al. |
| 7,414,319 B2 | 8/2008 | Lin et al. |
| 7,419,851 B2 | 9/2008 | Lin et al. |
| 7,456,083 B2 | 11/2008 | Noma et al. |
| 2003/0214048 A1 | 11/2003 | Wu et al. |
| 2004/0041260 A1 | 3/2004 | Wood et al. |
| 2004/0235270 A1* | 11/2004 | Noma et al. ............ 438/460 |
| 2004/0245530 A1 | 12/2004 | Kameyama et al. |
| 2005/0003649 A1 | 1/2005 | Takao |
| 2005/0176235 A1 | 8/2005 | Noma et al. |
| 2005/0253211 A1 | 11/2005 | Minamio et al. |
| 2006/0131736 A1 | 6/2006 | Jansman et al. |
| 2007/0071970 A1* | 3/2007 | Koike et al. ............ 428/343 |
| 2007/0131954 A1 | 6/2007 | Murayama et al. |
| 2007/0177360 A1 | 8/2007 | Shiraishi et al. |
| 2007/0210437 A1 | 9/2007 | Noma et al. |
| 2009/0290474 A1* | 11/2009 | Kimura et al. ......... 369/112.01 |
| 2010/0164086 A1 | 7/2010 | Noma et al. |
| 2010/0326429 A1* | 12/2010 | Cumpston et al. ......... 126/710 |

FOREIGN PATENT DOCUMENTS

| | | |
|---|---|---|
| JP | 10-256001 | 9/1998 |
| JP | 2001-85603 | 3/2001 |
| JP | 2001-223297 A | 8/2001 |
| JP | 2002-33440 | 1/2002 |
| JP | 2002-512436 A1 | 4/2002 |
| JP | 2003-92375 | 3/2003 |
| JP | 2003-234431 | 8/2003 |
| JP | 2004-273561 A | 9/2004 |
| JP | 2004-281963 | 10/2004 |
| JP | 2004-343088 | 12/2004 |
| JP | 2004-363380 | 12/2004 |
| JP | 2005-501414 | 1/2005 |
| JP | 2005-072554 A | 3/2005 |
| JP | 2005-79457 | 3/2005 |
| JP | 2005-123553 A | 5/2005 |
| JP | 2005-268701 | 9/2005 |
| JP | 2005-327893 | 11/2005 |
| JP | 2006-93367 | 4/2006 |
| JP | 2006-179718 | 7/2006 |
| JP | 2006-191126 | 7/2006 |
| JP | 2006-216657 | 8/2006 |
| JP | 2007-242813 | 9/2007 |
| WO | WO-99/40624 A1 | 8/1999 |

OTHER PUBLICATIONS

International Search Report, mailed Oct. 30, 2007, directed to counterpart International Patent Application No. PCT/JP2007/065575; 3 pages.

Noma et al., U.S. Office Action mailed Aug. 7, 2009, directed to U.S. Appl. No. 11/714,906; 24 pages.

Noma et al., U.S. Office Action mailed May 20, 2010, directed to U.S. Appl. No. 11/714,906; 11 pages.

Noma, T. et al., U.S. Office Action mailed May 13, 2011, directed to U.S. Appl. No. 12/376,917; 9 pages.

* cited by examiner

US 8,686,526 B2

SEMICONDUCTOR DEVICE AND METHOD OF MANUFACTURING THE SAME

CROSS-REFERENCE OF THE INVENTION

This application claims priority from Japanese Patent Application No. 2006-313379, the content of which is incorporated herein by reference in its entirety.

BACKGROUND OF THE INVENTION

1. Field of the Invention

The invention relates to a semiconductor device, particularly, a package type semiconductor device having a light receiving element.

2. Description of the Related Art

Conventionally, a CCD (Charge Coupled Device) sensor, a CMOS (Complementary Metal Oxide Semiconductor) sensor, a sensor for electrically detecting infrared rays (an IR sensor) and so on have been developed as light reading elements. These are elements that convert light into an electric signal.

These device elements are formed on a semiconductor die, and the semiconductor die is sealed in a given structure. FIG. 10 is a cross-sectional view showing a conventional sealing structure schematically.

A device element 101 (e.g. a light receiving element such as a CCD sensor, a CMOS sensor, an infrared ray sensor or the like) and pad electrodes 102 electrically connected to the device element 101 are formed on the front surface of a semiconductor substrate 100 made of silicon or the like.

The semiconductor substrate 100 is attached to a supporting substrate 103 (e.g. a glass epoxy substrate) with an adhesive layer (not shown) being interposed therebetween. Through-holes 104 are formed in the supporting substrate 103, penetrating therethrough from its front surface to its back surface. Lead electrodes 105 made of a conductor such as solder, aluminum or the like are formed in the through-holes 104. The lead electrodes 105 are connected to the pad electrodes 102 through bonding wires 106.

Transparent epoxy resin for sealing 107 is formed over the front surface of the supporting substrate 103, covering all of the semiconductor substrate 100, the bonding wires 106 and so on.

When this semiconductor device is mounted on a packaging substrate (not shown), the lead electrodes 105 on the back side of the supporting substrate 103 are connected to wiring patterns on the packaging substrate.

Recently, the next generation optical disks called the Blu-ray Disk and the HD-DVD (High Definition Digital Versatile Disk) are being developed. When light having a defined wavelength (about 400 to 415 nm) (hereafter, called a blue-violet laser) used for these optical disks impinges on the sealing resin in the above described structure (the epoxy resin 107), the resin is degraded and this degraded resin causes reduction in the operation quality of the semiconductor device (the transmittance of the blue-violet laser or the durability of the semiconductor device). This degradation of the resin has not been taken as a big problem before the above described next generation optical disk is developed.

The resin degradation herein is that the resin is, for example, yellowed, and its transparency is degraded. The resin degradation may occur due to breaking of intermolecular bonds of the resin by a blue-violet laser or heat caused by the blue-violet laser and oxidation of the resin.

For avoiding this problem, the sealing epoxy resin 107 is not formed on the device element 101 in the semiconductor device receiving a blue-violet laser, as shown in FIG. 11. It means that the device element 101 is mounted on the other packaging substrate, being exposed to outside. The relevant technique is described in Japanese Patent Application Publication No. 2005-123553.

In the conventional semiconductor device receiving a blue-violet laser described in FIG. 11, the device element 101 is exposed. Therefore, foreign substances may often adhere to the front surface of the device element 101 during the manufacturing process or in actual use, causing another problem of reduction in the reliability and yield of the device.

SUMMARY OF THE INVENTION

The invention is directed to providing a sealing structure preferable for a semiconductor device receiving a blue-violet laser. The invention provides a semiconductor device including: a semiconductor substrate having a device element on its front surface, the device element converting a blue-violet laser into an electric signal; and an optically transparent substrate of which a back surface faces the semiconductor substrate and attached to the front surface of the semiconductor substrate with an adhesive layer being interposed therebetween, wherein the adhesive layer contains transparent silicone and the device element is covered by the optically transparent substrate.

The semiconductor device of the invention further includes a protection layer covering a side surface of the adhesive layer.

The invention also provides a method of manufacturing a semiconductor device, including: providing a semiconductor substrate having a device element on its front surface, the device element converting a blue-violet laser into an electric signal; and attaching an optically transparent substrate to the front surface of the semiconductor substrate with an adhesive layer containing transparent silicone being interposed therebetween to seal the device element by the optically transparent substrate.

DETAILED DESCRIPTION OF THE INVENTION

An embodiment of the invention will be described referring to figures. FIGS. 1 to 8 are cross-sectional views or plan views showing a process of manufacturing a semiconductor device in due order.

Figure 1:
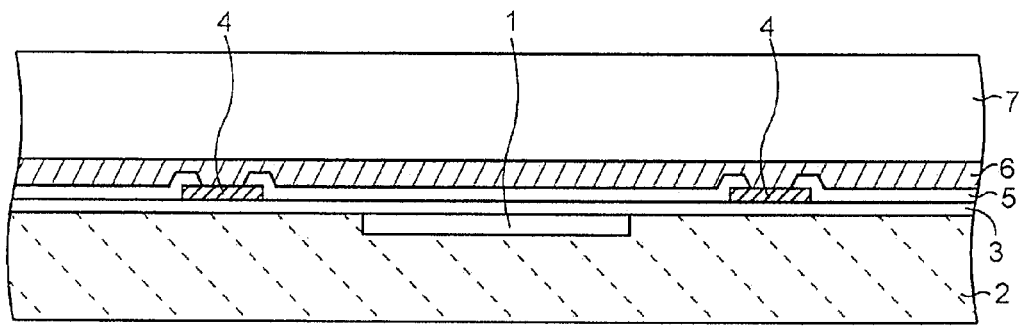
FIGS. 1, 2, 4 to 8 are cross-sectional views for explaining a semiconductor device and a method of manufacturing the semiconductor device of the invention.

First, as shown in FIG. 1, a semiconductor substrate 2 made of silicon (Si) or the like having a device element 1 on its front surface is prepared. The device element 1 is an element having a function of converting a blue-violet laser into an electric signal. Then, a first insulation film 3 (e.g. a silicon oxide film formed by a thermal oxidation method, a CVD method, or the like) is formed on the front surface of the semiconductor substrate 2 to have a thickness of, for example, 2 μm.

Then, a metal layer made of aluminum (Al), an aluminum alloy, copper (Cu) or the like is formed by a sputtering method, a plating method or the other film deposition method. This metal layer is then selectively etched using a resist layer (not shown) as a mask to form pad electrodes 4 having a thickness of, for example, 1 μm on the first insulation film 3. The pad electrode 4 is an electrode for external connection, which is electrically connected to the device element 1 or the other peripheral element through wiring (not shown). Although the pad electrodes 4 are disposed on the both sides of the device element 1 in FIG. 1, the position thereof is not limited to this and these may be located above the device element 1.

Then, a passivation film 5 (e.g. a silicon nitride film formed by a CVD method) is formed on the front surface of the semiconductor substrate 2 to partially cover the pad electrodes 4 or entirely cover the pad electrodes 4. In FIG. 1, the passivation film 5 partially covers the pad electrodes 4.

Then, an optically transparent substrate 7 is attached to the front surface of the semiconductor substrate 2 including the pad electrodes 4, with an adhesive layer 6 being interposed therebetween. The adhesive layer 6 is preferably made of transparent resin at least containing transparent silicone. It was found that transparent silicone SCR-1011 of Shin-Etsu Chemical Co., Ltd. has the most excellent chemical stability against the blue-violet laser. Therefore, at the present time, this transparent silicone (SCR-1011) is understood to be most suitable as the material of the adhesive layer 6 of this embodiment. It is preferable that the adhesive layer 6 contains epoxy silicone and organosilane.

The optically transparent substrate 7 is made of a transparent or semitransparent material (e.g. glass, quartz or the like), and has a light transmission property. The optically transparent substrate 7 has a function of supporting the semiconductor substrate 2, protecting the front surface of the device element 1, and preventing the adhesive layer 6 from being exposed to outside air. This prevents the degradation of the adhesive layer 6 due to oxidation.

Then, back-grinding is performed to the back surface of the semiconductor substrate 2 using a back surface grinder to reduce the thickness of the semiconductor substrate 2 to a predetermined thickness (e.g. about 50 to 100 μm). This grinding process may be replaced by an etching process or the combination of the grinder and the etching process. There is also a case where the grinding process is not necessary depending on the application or specification of an end-product and the initial thickness of the provided semiconductor substrate 2.

Figure 2:
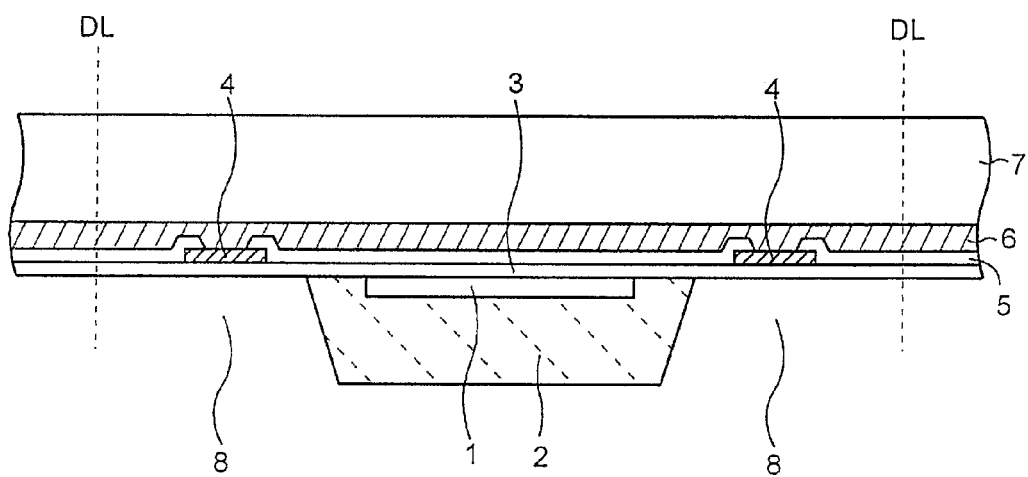

Then, as shown in FIG. 2, the semiconductor substrate 2 is selectively etched only in regions corresponding to the pad electrodes 4 from the back surface of the semiconductor substrate 2 to partially expose the first insulation film 3. Hereafter, this exposed portion is referred to as an opening 8.

Figure 3A:
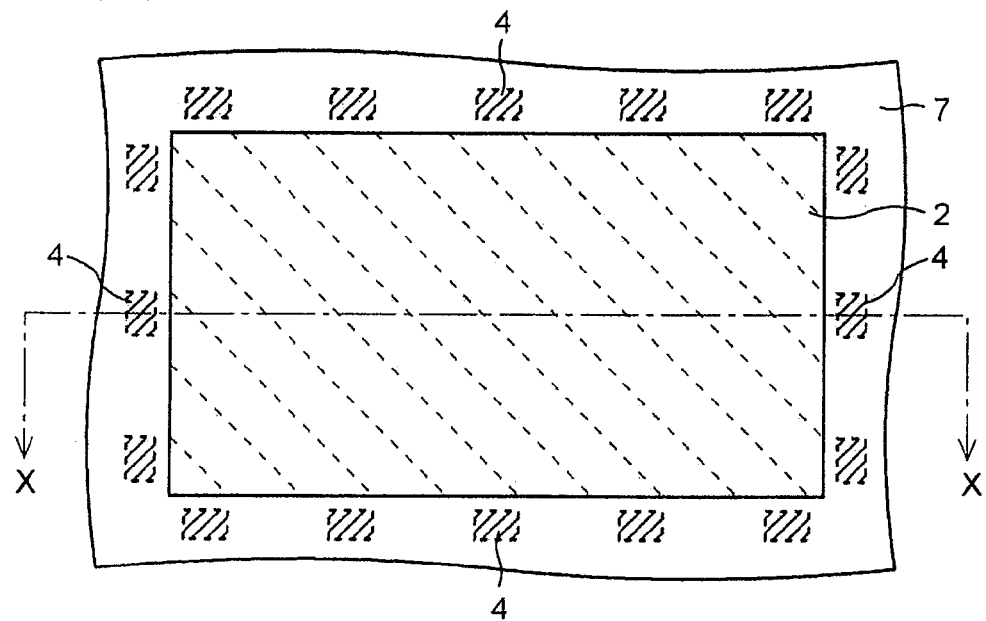
FIGS. 3A and 3B are plan views for explaining the semiconductor device and the method of manufacturing the semiconductor device of the invention.
Figure 3B:
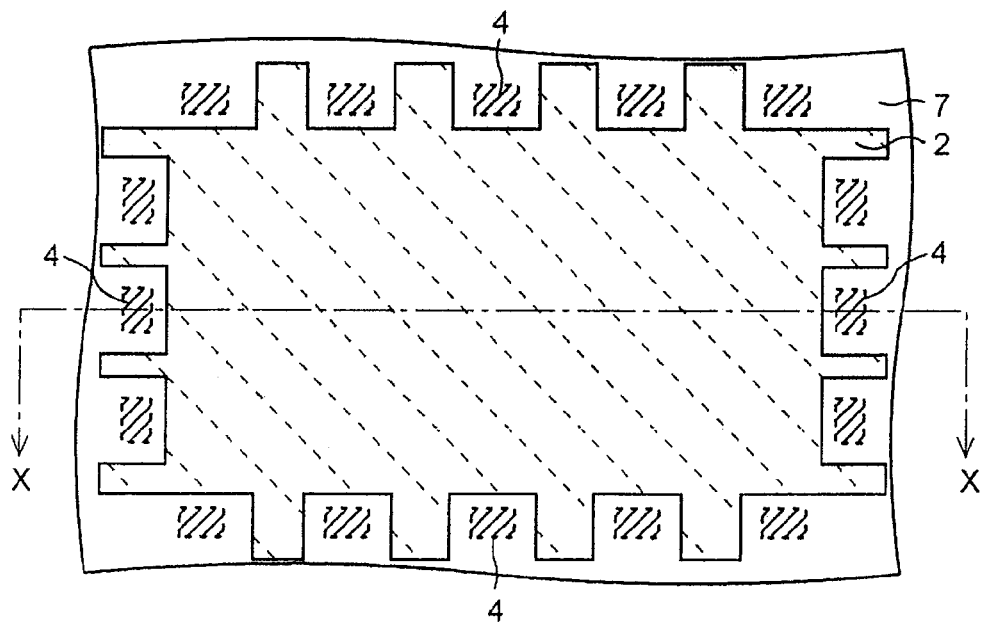

This selective etching of the semiconductor substrate 2 will be described referring to FIGS. 3A and 3B. FIGS. 3A and 3B are schematic plan views on the lower side (on the semiconductor substrate 2 side), and FIG. 2 corresponds to a cross-sectional view along line X-X of FIGS. 3A and 3B.

As shown in FIG. 3A, the semiconductor substrate 2 may be etched into an almost rectangular shape smaller than the optically transparent substrate 7. Alternatively, as shown in FIG. 3B, the semiconductor substrate 2 may be etched only in a region formed with the pad electrodes 4 so as to have an uneven periphery. The latter provides the larger overlapping area between the semiconductor substrate 2 and the optically transparent substrate 7 and the semiconductor substrate 2 remains near the periphery of the optically transparent substrate 7. Therefore, the latter structure is preferable for enhancing the support strength of the optically transparent substrate 7 for the semiconductor substrate 2. Furthermore, since the latter structure prevents the optically transparent substrate 7 from warping due to the difference in coefficient of thermal expansion between the semiconductor substrate 2 and the optically transparent substrate 7, cracking or separation in the semiconductor device is prevented. It is noted that the semiconductor substrate 2 may be designed into the other plane shape than the shape shown in FIGS. 3A and 3B.

Furthermore, although the sidewall of the semiconductor substrate 2 is etched obliquely so that the width of the semiconductor substrate 2 is wider on the front surface side in this embodiment, the semiconductor substrate 2 may be etched to have the constant width and form the sidewall perpendicular to the main surface of the optically transparent substrate 7.

Figure 4:
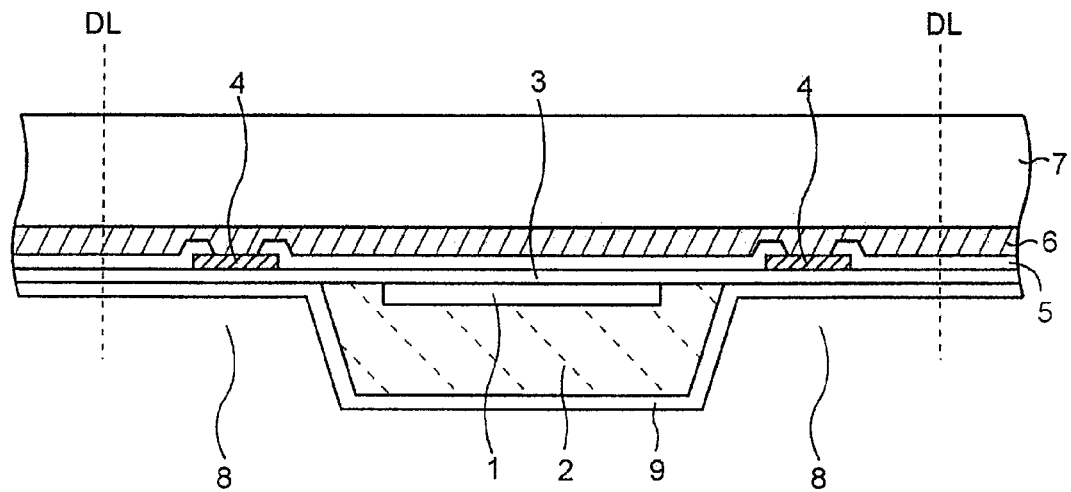

Then, as shown in FIG. 4, a second insulation film 9 is formed in the opening 8 and on the back surface of the semiconductor substrate 2. This second insulation film 9 is an insulation film such as a silicon oxide film or a silicon nitride film formed by a plasma CVD method, for example.

Figure 5:
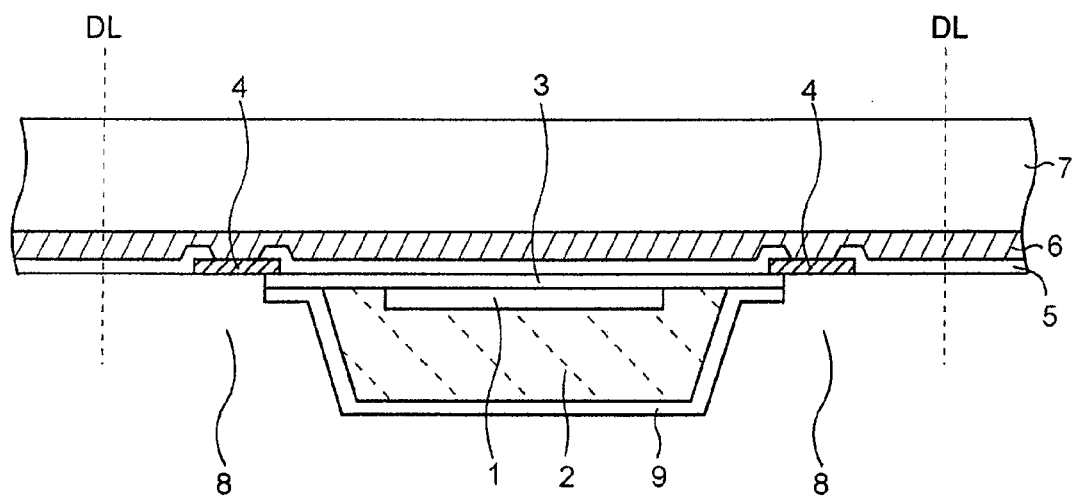

Then, as shown in FIG. 5, the first insulation film 3 and the second insulation film 9 are selectively etched using a resist layer (not shown) as a mask. By this etching, the first insulation film 3 and the second insulation film 9 formed in regions from a portion of the pad electrodes 4 to the dicing lines DL are removed to expose at least a portion of each of the pad electrodes 4 on the bottom of the opening 8.

Figure 6:
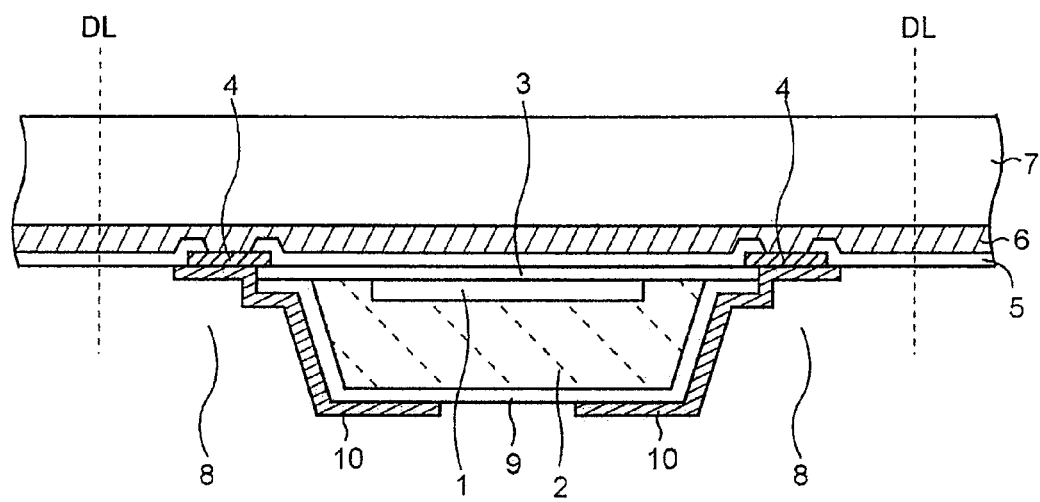

Then, a conductive layer made of aluminum (Al), copper (Cu) or the like for wiring layers 10 is formed by a sputtering method, a plating method or the other film deposition method to have a thickness of, for example, 1 μm. Then, this conductive layer is selectively etched using a resist layer (not shown) as a mask. By this etching, the conductive layer forms the wiring layers 10 along the side surface of the semiconductor substrate 2 with the second insulation film 9 being interposed therebetween, as shown in FIG. 6. Each of the wiring layers 10 is connected to at least a portion of each of the pad electrodes 4 and extends so as to cover a portion of the back surface of the semiconductor substrate 2.

Figure 7:
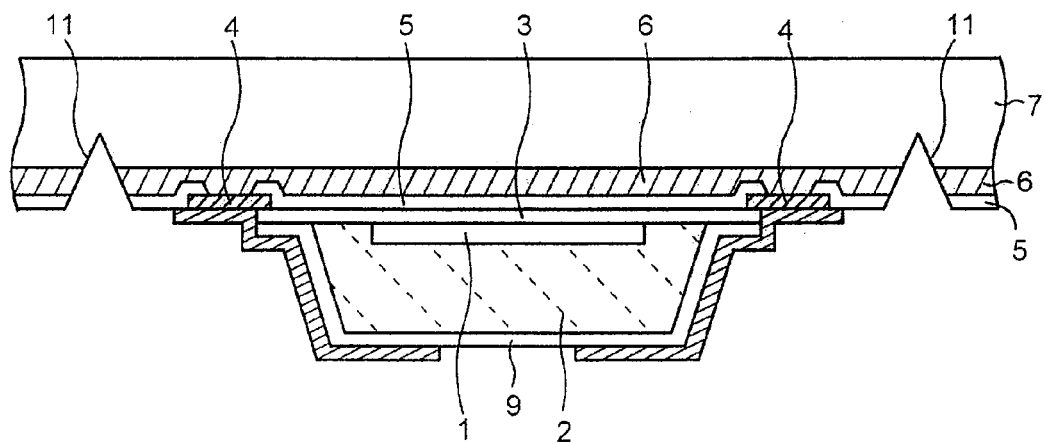

Then, the optically transparent substrate 7 is partially removed from the semiconductor substrate 2 side using a dicing blade or by etching to form notch portions 11. The cross-sectional shape of each of the notch portions 11 is not limited to the V-shape as shown in FIG. 7 and may be an elliptic shape or almost rectangular shape. It means that the notch portion 11 may have any shape as long as the side surface of the adhesive layer 6 is exposed by the formation of the notch portion 11.

Figure 8:
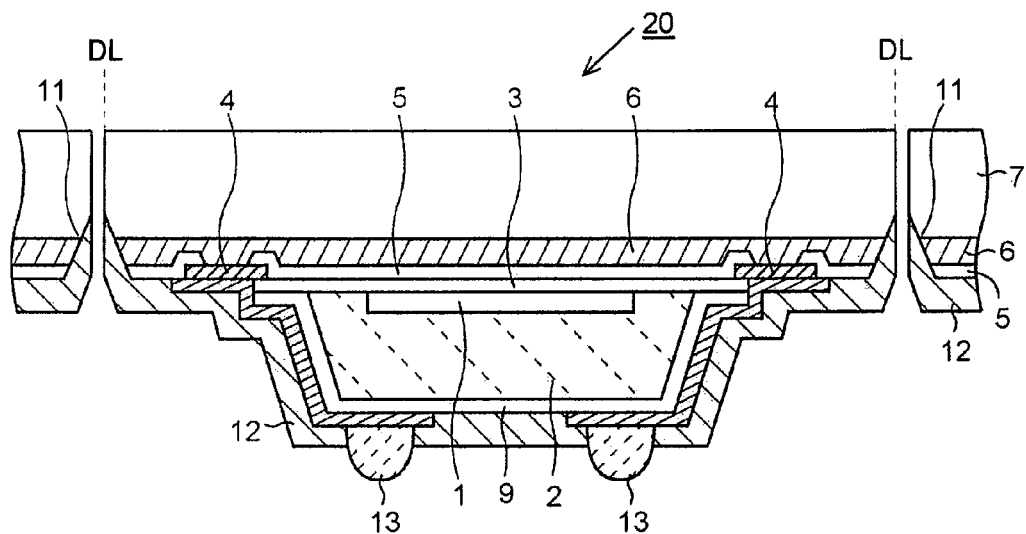

Then, as shown in FIG. 8, a protection layer 12 having a thickness of, for example, 10 μm is formed to have openings in regions for formation of the conductive terminals 13 that will be described below. The protection layer 12 is formed as follows, for example. First, an organic material such as polyimide type resin, a solder resist or the like is applied to the whole surface by a coating method and a heat treatment (pre-bake) is performed thereto. Then, exposure and development are performed to the applied organic material to form openings exposing predetermined regions, and then a heat treatment (post-bake) is performed thereto, thereby providing the protection layer 12 having openings in the regions for formation of the conductive terminals 13. Since the notch portions 11 are formed in this embodiment, the side surface of the optically transparent substrate 7 is partially covered by the protection layer 12. It means that the side surface of the adhesive layer 6 is completely covered by the protection layer 12. Therefore, the adhesive layer 6 is prevented from being exposed to outside air, and corrosive substances (e.g. water) are prevented from infiltrating into the device element 1 and the adhesive layer 6.

Then, electrode connection layers (not shown) made of, for example, nickel and gold or the like are formed on the wiring layers 10 exposed in the openings of the protection layer 12. Then, a conductive material (e.g. solder) is screen-printed on the electrode connection layers (not shown) exposed in the openings of the protection layer 12, and this conductive material is reflowed by a heat treatment. In this manner, as shown in FIG. 8, the conductive terminals 13 electrically connected to the pad electrodes 4 through the wiring layers 10 are formed on the back surface of the semiconductor substrate 2. The method of forming the conductive terminals 13 is not limited to the above, and these may be formed by an electrolytic plating method or a so-called dispensing (coating) method where a solder or the like is applied to a predetermined region with a dispenser. The conductive terminals 13 may be formed of gold, copper or nickel, and the material thereof is not particularly limited.

Then, dicing is performed along the dicing lines DL that are the boundaries of a number of semiconductor devices and divided into individual semiconductor devices 20.

By performing the above described process, the chip size package type semiconductor device having the device element 1 is completed.

Figure 11:
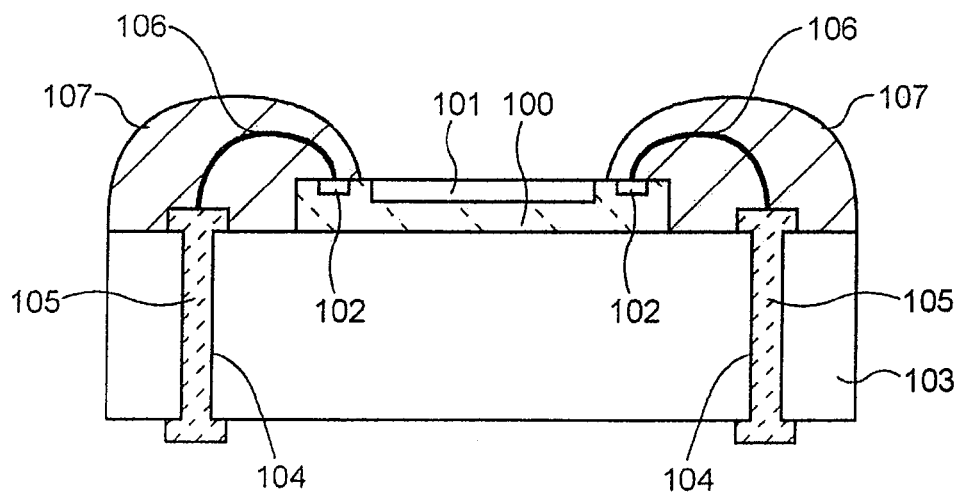

The device element 1 of this embodiment is not exposed to outside unlike the conventional structure (see FIG. 11), and covered by the adhesive layer 6 and the optically transparent substrate 7. This prevents foreign substances from adhering to the front surface of the device element 1, and enhances the reliability and yield of the semiconductor device receiving a blue-violet laser.

This embodiment uses transparent silicone (SCR-1011) having high stability in the intermolecular bonds against a blue-violet laser for the adhesive layer 6. Furthermore, the adhesive layer 6 is completely covered by the optically transparent substrate 7 and the protection layer 12, and prevented from being exposed to outside air. Therefore, the semiconductor device of this embodiment has a structure where the intermolecular bonds of the adhesive layer 6 are difficult to be broken by a blue-violet laser and the adhesive layer 6 is difficult to be oxidized. This prevents the degradation of the adhesive layer 6, provides excellent operating characteristics, and enhances the durability.

It is noted that the adhesive layer 6 is degraded by receiving a blue-violet laser when the other resin (e.g. epoxy resin) than SCR-1011 is used for the adhesive layer 6 in the structure similar to this embodiment. Therefore, besides the sealing structure of this embodiment, it is preferable to use the same type of transparent silicone as SCR-1011 for the adhesive layer 6 in the semiconductor device receiving a blue-violet laser.

Figure 10:
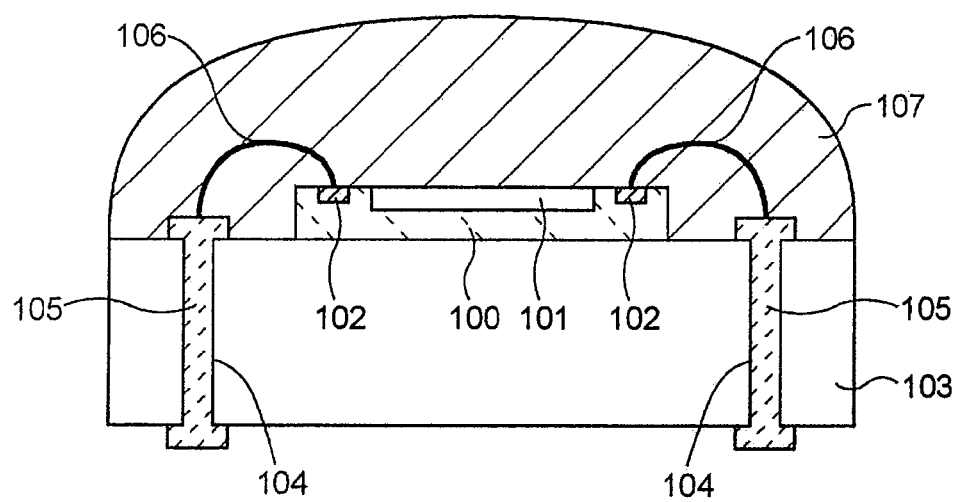
FIGS. 10 and 11 are cross-sectional views for explaining a conventional semiconductor device.

Differing from the conventional structure (see FIGS. 11 and 12), the adhesive layer 6 is formed between the optically transparent substrate 7 and the semiconductor substrate 2. This makes it possible to largely thin the adhesive layer 6. For example, the thickness of the resin of this embodiment (the adhesive layer 6) is only 5 µm, while the thickness of the conventional resin shown in FIG. 10 (the epoxy resin 107) is 1.2 mm. Since the thinner adhesive layer 6 is thus realized, even if the adhesive layer 6 is degraded in actual use (when receiving the blue-violet laser), the reduction of the operating characteristics of the semiconductor device due to this is much less than those of conventional structures.

It is also possible as a modification to selectively form the adhesive layer 6 not covering the device element 1 between the semiconductor substrate 2 and the optically transparent substrate 7, instead of uniformly forming the adhesive layer 6 therebetween. In this structure, the device element 1 is sealed in a cavity space between the semiconductor substrate 2 and the optically transparent substrate 7, and the device element 1 is not covered by the adhesive layer. This prevents the reduction of the operating characteristics caused by the degradation of the adhesive layer. However, the described embodiment employs the structure where the degradation of the adhesive layer 6 is prevented. Therefore, it is less necessary to form the cavity space by selectively forming the adhesive layer 6. Accordingly, in this embodiment, the process of forming the cavity (e.g. the control of the coating position of the adhesive layer 6 when it is formed) may be omitted, thereby simplifying the manufacturing process.

The invention is not limited to the above embodiment and the modification of the design is possible within the scope of the invention. For example, the semiconductor device may be formed as described below. It is noted that the same numerals are given to the same components as those of the above described embodiment and the description thereof will be omitted.

Figure 9:
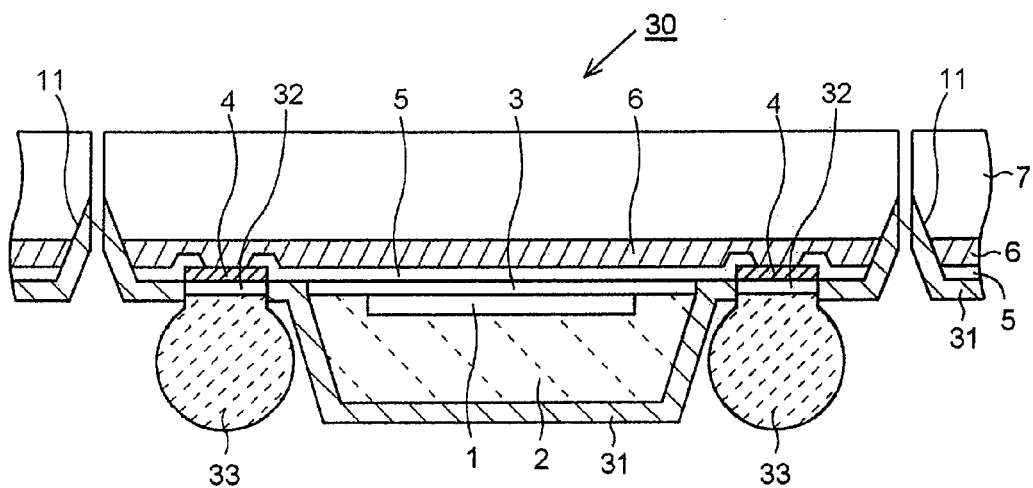
FIG. 9 is a cross-sectional view for explaining the other embodiment of the invention.

A semiconductor device 30 of the other embodiment shown in FIG. 9 has openings in positions corresponding to the pad electrodes 4, and formed with a protection layer 31 covering the side and back surface of the semiconductor substrate 2. Electrode connection layers 32 are formed on the pad electrodes 4 in the positions of the openings of the protection layer 31. The electrode connection layer 32 is a layer of, for example, a nickel (Ni) layer and a gold (Au) layer laminated in this order, and formed by a lift-off method where these metals are sequentially sputtered using a resist layer as a mask and then the resist layer is removed or by a plating method. Conductive terminals 33 made of solder or the like are formed on the pad electrodes 4 with the electrode connection layers 32 being interposed therebetween. In this manner, the conductive terminals 33 may be located adjacent to the sidewall of the semiconductor substrate 2, without wiring layers formed on the side and back surface of the semiconductor substrate 2.

The invention is widely applicable as a technique for sealing a device element receiving a blue-violet laser. Although the above embodiments are described for the BGA type semiconductor device having the ball-shaped conductive terminals 13 or 33, the invention is also applicable to the LGA (Land Grid Array) type semiconductor device.

In the structures explained above, the front surface of the device element is covered by the optically transparent substrate. Therefore, foreign substances are prevented from adhering to the device element, thereby enhancing the reliability and yield of the semiconductor device.

Furthermore, the adhesive layer is covered by the optically transparent substrate and prevented from being exposed to outside air. This prevents the degradation of the adhesive layer itself due to a blue-violet laser, and provides the device with excellent operating characteristics and durability. This effect is enhanced more by covering the side surface of the adhesive layer by the protection layer.

What is claimed is:

1. A semiconductor device comprising:
    a blue-violet laser emitting device emitting laser light having a wavelength between 400 and 415 nm;
    a semiconductor substrate comprising a device element formed on a front surface thereof, the device element being configured to receive the laser light emitted from the blue-violet laser emitting device and to convert the received laser light into an electric signal;

a transparent substrate attached to the front surface of the semiconductor substrate so as to cover the device element; and an adhesive layer comprising a transparent silicone and attaching the transparent substrate to the front surface of the semiconductor substrate, the adhesive layer covering the device element.

2. The semiconductor device of claim 1, wherein the adhesive layer comprises an epoxy silicone and an organosilane.

3. The semiconductor device of claim 1, further comprising a protection layer covering a side surface of the adhesive layer.

4. The semiconductor device of claim 3, further comprising a pad electrode electrically connected to the device element and a wiring layer electrically connected to the pad electrode and covering a side and a back surface of the semiconductor substrate, wherein the protection layer covers the side and the back surface of the semiconductor substrate and has an opening in a portion of the back surface, and a conductive terminal is disposed in the opening so as to be electrically connected to the wiring layer.

5. The semiconductor device of claim 3, further comprising a pad electrode electrically connected to the device element, wherein the protection layer covers a back surface of the semiconductor substrate and has an opening at the pad electrode, and a conductive terminal is disposed in the opening so as to be electrically connected to the pad electrode.

6. The semiconductor device of claim 3, further comprising a pad electrode electrically connected to the device element, wherein the protection layer covers a back surface of the semiconductor substrate and has an opening at the pad electrode, and a conductive terminal is disposed in the opening so as to be electrically connected to the pad electrode.

7. The semiconductor device of claim 3, wherein the transparent substrate comprises a slanting portion slanting from a surface of the transparent substrate attached to the front surface of the semiconductor substrate, and the protection layer covers the slanting portion.

8. The semiconductor device of claim 7, further comprising a pad electrode electrically connected to the device element and a wiring layer electrically connected to the pad electrode and covering a side and a back surface of the semiconductor substrate, wherein the protection layer covers the side and the back surface of the semiconductor substrate and has an opening in a portion of the back surface, and a conductive terminal is disposed in the opening so as to be electrically connected to the wiring layer.

9. The semiconductor device of claim 7, further comprising a pad electrode electrically connected to the device element, wherein the protection layer covers a back surface of the semiconductor substrate and has an opening at the pad electrode, and a conductive terminal is disposed in the opening so as to be electrically connected to the pad electrode.

10. The semiconductor device of claim 3, wherein the adhesive layer comprises an epoxy silicone and an organosilane.

11. The semiconductor device of claim 10, further comprising a pad electrode electrically connected to the device element and a wiring layer electrically connected to the pad electrode and covering a side and a back surface of the semiconductor substrate, wherein the protection layer covers the side and the back surface of the semiconductor substrate and has an opening in a portion of the back surface, and a conductive terminal is disposed in the opening so as to be electrically connected to the wiring layer.

12. The semiconductor device of claim 10, further comprising a pad electrode electrically connected to the device element, wherein the protection layer covers a back surface of the semiconductor substrate and has an opening at the pad electrode, and a conductive terminal is disposed in the opening so as to be electrically connected to the pad electrode.

13. The semiconductor device of claim 7, wherein the adhesive layer comprises an epoxy silicone and an organosilane.

14. The semiconductor device of claim 13, further comprising a pad electrode electrically connected to the device element and a wiring layer electrically connected to the pad electrode and covering a side and a back surface of the semiconductor substrate, wherein the protection layer covers the side and the back surface of the semiconductor substrate and has an opening in a portion of the back surface, and a conductive terminal is disposed in the opening so as to be electrically connected to the wiring layer.

15. The semiconductor device of claim 13, further comprising a pad electrode electrically connected to the device element, wherein the protection layer covers a back surface of the semiconductor substrate and has an opening at the pad electrode, and a conductive terminal is disposed in the opening so as to be electrically connected to the pad electrode.

* * * * *